United States Patent
Gong

(10) Patent No.: US 11,706,868 B2
(45) Date of Patent: Jul. 18, 2023

(54) CIRCUIT BOARD AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Qing Gong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/761,557

(22) PCT Filed: Apr. 16, 2021

(86) PCT No.: PCT/CN2021/087879
§ 371 (c)(1),
(2) Date: Mar. 17, 2022

(87) PCT Pub. No.: WO2021/213283
PCT Pub. Date: Oct. 28, 2021

(65) Prior Publication Data
US 2022/0386449 A1    Dec. 1, 2022

(30) Foreign Application Priority Data
Apr. 23, 2020 (CN) .......................... 202010327142.4

(51) Int. Cl.
*H05K 1/02*    (2006.01)
*H05K 1/14*    (2006.01)

(52) U.S. Cl.
CPC ......... *H05K 1/0216* (2013.01); *H05K 1/0224* (2013.01); *H05K 1/144* (2013.01);
(Continued)

(58) Field of Classification Search
CPC .... H05K 1/0216; H05K 1/0224; H05K 1/144; H05K 2201/144; H05K 2201/10128
(Continued)

(56) References Cited

U.S. PATENT DOCUMENTS

| | | | |
|---|---|---|---|
| 5,173,150 A | 12/1992 | Kanaoka et al. | |
| 6,760,969 B2* | 7/2004 | Kumakura | H01R 12/7076 361/784 |
| 2004/0233651 A1* | 11/2004 | Liu | H05K 1/16 29/830 |

FOREIGN PATENT DOCUMENTS

| | | |
|---|---|---|
| CN | 102548189 A | 7/2012 |
| CN | 206413249 U | 8/2017 |

(Continued)

OTHER PUBLICATIONS

Notification to Grant Patent Right for Invention issued by the Chinese Patent Office for Application No. 202010327142.4 dated Jul. 21, 2021.
(Continued)

*Primary Examiner* — Andargie M Aychillhum
(74) *Attorney, Agent, or Firm* — IP & T Group LLP

(57) ABSTRACT

A circuit board includes at least one circuit board unit sequentially stacked in a thickness direction of the circuit board, an insulating layer, an electromagnetic shielding layer, and a barrier layer. The circuit board unit includes a substrate layer, and two conductive layers respectively disposed on two opposite sides of the substrate layer in a thickness direction of the substrate layer, and each of the conductive layers includes a plurality of signal lines. The insulating layer is located on a side of an outermost conductive layer away from the substrate layer. The electromagnetic shielding layer is located on a side of the insulating layer away from the substrate layer. The barrier layer is located between the electromagnetic shielding layer and the
(Continued)

outermost conductive layer. The barrier layer at least covers a plurality of signal lines in the outermost conductive layer.

19 Claims, 6 Drawing Sheets

(52) U.S. Cl.
CPC .................. *H05K 2201/041* (2013.01); *H05K 2201/10128* (2013.01)

(58) Field of Classification Search
USPC ........................................................ 361/784
See application file for complete search history.

(56) References Cited

FOREIGN PATENT DOCUMENTS

| | | |
|---|---|---|
| CN | 110027268 A | 7/2019 |
| CN | 209134681 U | 7/2019 |
| CN | 111491441 A | 8/2020 |

OTHER PUBLICATIONS

First Office Action issued by the Chinese Patent Office for Application No. 202010327142.4 dated Jan. 5, 2021.

\* cited by examiner

CIRCUIT BOARD AND DISPLAY DEVICE

CROSS-REFERENCE TO RELATED APPLICATIONS

This application is a national phase entry under 35 USC 371 of International Patent Application No. PCT/CN 2021/087879 filed on Apr. 16, 2021, which claims priority to Chinese Patent Application No. 202010327142.4, filed on Apr. 23, 2020, which are incorporated herein by reference in their entirety.

TECHNICAL FIELD

The present disclosure relates to the field of circuit board technologies, and in particular, to a circuit board and a display device.

BACKGROUND

In a touch display product, a display-related circuit board and a touch-related circuit board play a key role in an environmental reliability test. If the design of the circuit board fails to meet the reliability requirement, the verification test of a new product fails, so that mass production cannot be realized, and when the product is sold to the market, a product performance reliability risk exists.

SUMMARY

In an aspect, a circuit board is provided. The circuit board includes at least one circuit board unit, an insulating layer, an electromagnetic shielding layer, and a barrier layer. The at least one circuit board unit is sequentially stacked in a thickness direction of the circuit board. The circuit board unit includes a substrate layer and two conductive layers respectively disposed on two opposite sides of the substrate layer in a thickness direction of the substrate layer, and each of the conductive layers includes a plurality of signal lines. The insulating layer is located on a side of an outermost conductive layer away from the substrate layer. The electromagnetic shielding layer is located on a side of the insulating layer away from the substrate layer. The barrier layer is located between the electromagnetic shielding layer and the outermost conductive layer. The barrier layer at least covers a plurality of signals lines in the outermost conductive layer.

In some embodiments, the circuit board includes: a first conductive layer and a second conductive layer respectively located on two opposite outermost sides in the thickness direction of the circuit board; a first insulating layer, a first barrier layer, and a first electromagnetic shielding layer that are disposed on a side of the first conductive layer away from the substrate layer, in a direction away from the circuit board in the thickness direction of the circuit board, the first insulating layer, the first barrier layer, and the first electromagnetic shielding layer being sequentially arranged, or the first barrier layer, the first insulating layer, and the first electromagnetic shielding layer being sequentially arranged; and a second insulating layer, a second barrier layer, and a second electromagnetic shielding layer that are disposed on a side of the second conductive layer away from the substrate layer, in a direction away from the circuit board in the thickness direction of the circuit board, the second insulating layer, the second barrier layer, and the second electromagnetic shielding layer being sequentially arranged, or the second barrier layer, the second insulating layer, and the second electromagnetic shielding layer being sequentially arranged.

In some embodiments, the at least one circuit board unit includes one circuit board unit, and the first conductive layer and the second conductive layer are respectively located on two opposite sides of the same substrate layer.

In some embodiments, the at least one circuit board unit includes a plurality of circuit board units, and two circuit board units respectively located on the two opposite outermost sides are referred to as a first circuit board unit and a second circuit board unit, respectively. The first conductive layer is located on a side of a substrate layer in the first circuit board unit proximate to the outside, and the second conductive layer is located on a side of a substrate layer in the second circuit board unit proximate to the outside.

In some embodiments, the circuit board further includes an adhesive layer disposed between two adjacent circuit board units. The adhesive layer is configured to bond the two adjacent circuit board units, and is configured such that the two adjacent circuit board units are insulated from each other.

In some embodiments, a contour line of an orthogonal projection of the barrier layer on the substrate layer is substantially overlapped with a contour line of an orthogonal projection of the insulating layer on the substrate layer.

In some embodiments, the outermost conductive layer has a signal line region, and the plurality of signal lines in the outermost conductive layer are located in the signal line region. A contour line of an orthogonal projection of the signal line region of the outermost conductive layer on the substrate layer is within a range of a contour line of an orthogonal projection of the barrier layer on the substrate layer.

In some embodiments, a distance between two adjacent sides of the contour line of the orthogonal projection of the barrier layer on the substrate layer and the contour line of the orthogonal projection of the signal line region of the outermost conductive layer on the substrate layer is in a range of 0.2 mm to 0.8 mm.

In some embodiments, the distance between two adjacent sides of the contour line of the orthogonal projection of the barrier layer on the substrate layer and the contour line of the orthogonal projection of the signal line region of the outermost conductive layer on the substrate layer is in a range of 0.5 mm to 0.8 mm.

In some embodiments, a shape of the barrier layer is substantially same as a shape of the signal line region of the outermost conductive layer.

In some embodiments, the outermost conductive layer further has a ground region. The outermost conductive layer further includes a ground pattern in the ground region.

In some embodiments, a boundary of the insulating layer substantially coincides with a boundary of the substrate layer.

In some embodiments, the barrier layer is located between the insulating layer and the electromagnetic shielding layer, and a plurality of protrusions are disposed in a surface of the barrier layer proximate to the substrate layer. An orthogonal projection of a protrusion on the substrate layer is at least partially overlapped with an orthogonal projection of a gap region between two adjacent signal lines in the outermost conductive layer on the substrate layer.

In some embodiments, the protrusion is strip-shaped, and extends in an extending direction of the signal lines.

In some embodiments, a surface of the barrier layer away from the substrate layer is substantially planar.

In some embodiments, a surface of the barrier layer away from the substrate layer is substantially parallel to a surface of the substrate layer.

In some embodiments, a thickness of a portion of the barrier layer that is opposite to the signal lines in the outermost conductive layer is in a range of 10 µm to 25 µm.

In some embodiments, a material of the insulating layer includes ink.

In some embodiments, a material of the barrier layer includes at least one of polyimide and epoxy resin.

In another aspect, a display device is provided. The display device includes a display panel and the circuit board in any of the above embodiments. The circuit board is electrically connected to the display panel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method, and an actual timing of a signal involved in the embodiments of the present disclosure.

DETAILED DESCRIPTION

Figure 1:
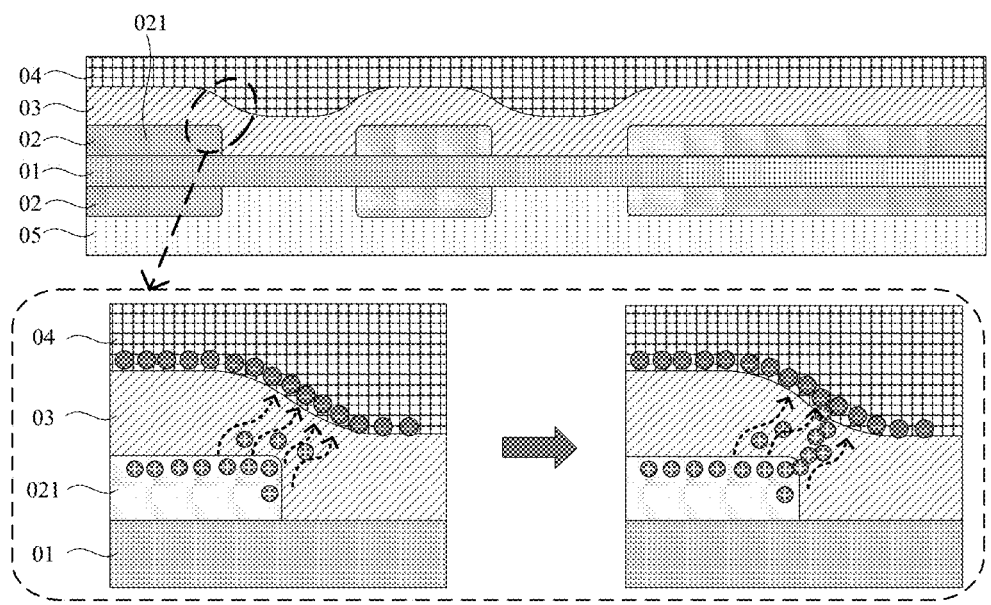
FIG. 1 is a schematic diagram showing migration of copper particles from an insulating ink layer to an electromagnetic shielding layer.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, a feature defined as "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

The use of the phase "applicable to" or "configured to" herein means an open and inclusive expression, which does not exclude devices that are applicable to or configured to perform additional tasks or steps.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

As shown in FIG. 1, a laminated structure of a conventional circuit board includes a substrate layer 01, copper layers 02, an insulating ink (PSR) layer 03, an electromagnetic shielding (EMI) layer 04, and an adhesive layer 05. The copper layer 02 includes a plurality of copper signal lines 021. At a transition position between the copper signal line 021 and an etching gap, the coating thickness of the PSR layer 03 is too thin, and in a reliability test in a power-on environment, an electric field is formed between the copper signal line 021 with a positive voltage signal and the EMI layer 04. Due to an action of the electric field, copper particles migrate to the EMI layer 04 and form dendrites in the migration process, so that the copper signal line 021 and the EMI layer 04 are finally short-circuited.

Figure 2:
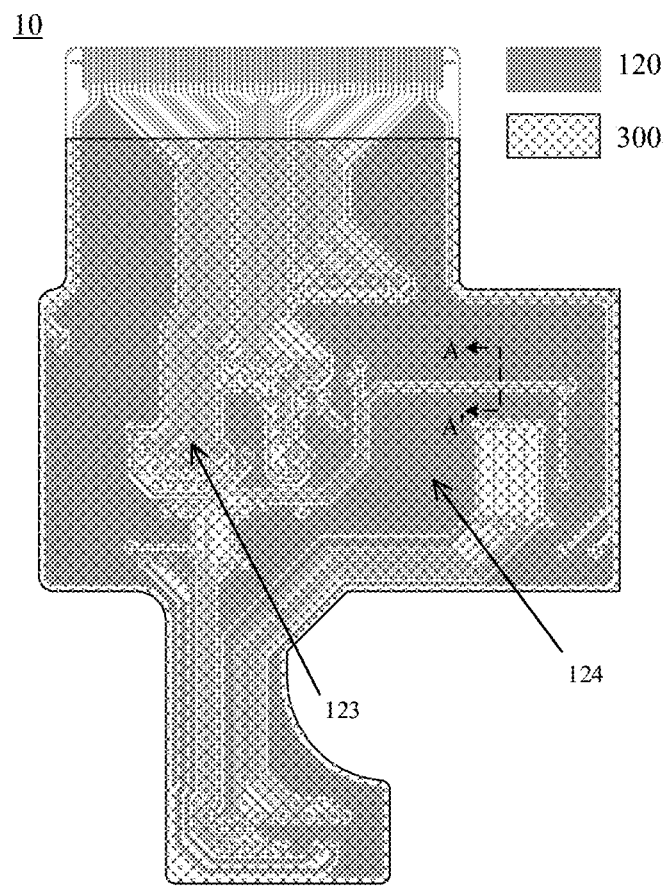
FIG. 2 is a top view of a circuit board, in accordance with some embodiments.
Figure 3:
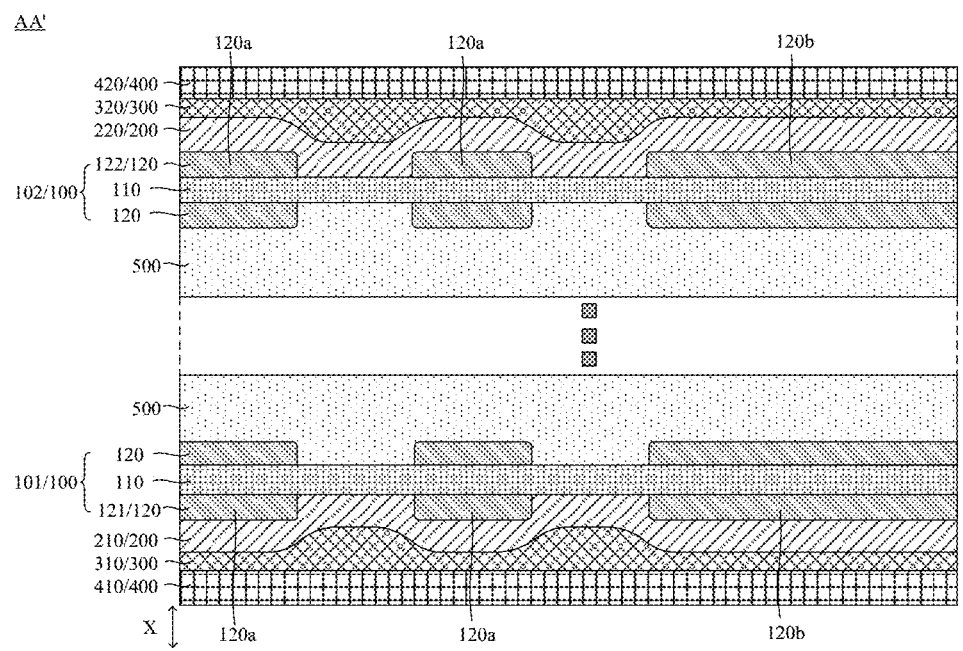
FIG. 3 is a sectional view of the circuit board shown in FIG. 2 taken along the AA' line.

Therefore, as shown in FIGS. 2 and 3, some embodiments of the present disclosure provide a circuit board 10. The circuit board 10 includes at least one circuit board unit 100 sequentially stacked in a thickness direction of the circuit board 10, insulating layer(s) 200, barrier layer(s) 300, and electromagnetic shielding layer(s) 400.

The number of the circuit board unit(s) 100 is not limited, and may be one, two, three, or more than three. For example, FIG. 6 shows one circuit board unit 100, and FIG. 7 shows three circuit board units 100.

As shown in FIG. 3, the circuit board unit 100 includes a substrate layer 110 and two conductive layers 120 respectively disposed on two opposite sides of the substrate layer 110 in a thickness direction X of the substrate layer 110. The conductive layer 120 includes a plurality of signal lines 120a. In some embodiments, the signal lines 120a are copper signal lines.

The insulating layer 200 is located on a side of an outermost conductive layer away from the substrate layer 110. It will be understood that two conductive layers 120 respectively located on two opposite outermost sides in a thickness direction (i.e., the thickness direction X of the substrate layer 110) of the circuit board 10 are outermost conductive layers, and are referred to as a first conductive layer 121 and a second conductive layer 122, respectively.

Figure 6:
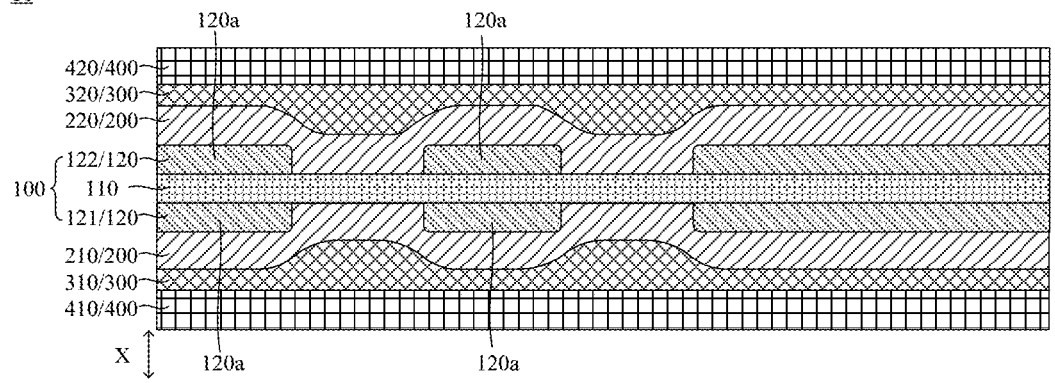
FIG. 6 is a sectional view of yet another circuit board taken along a direction perpendicular to an extending direction of signal lines in a conductive layer, in accordance with some embodiments.
Figure 7:
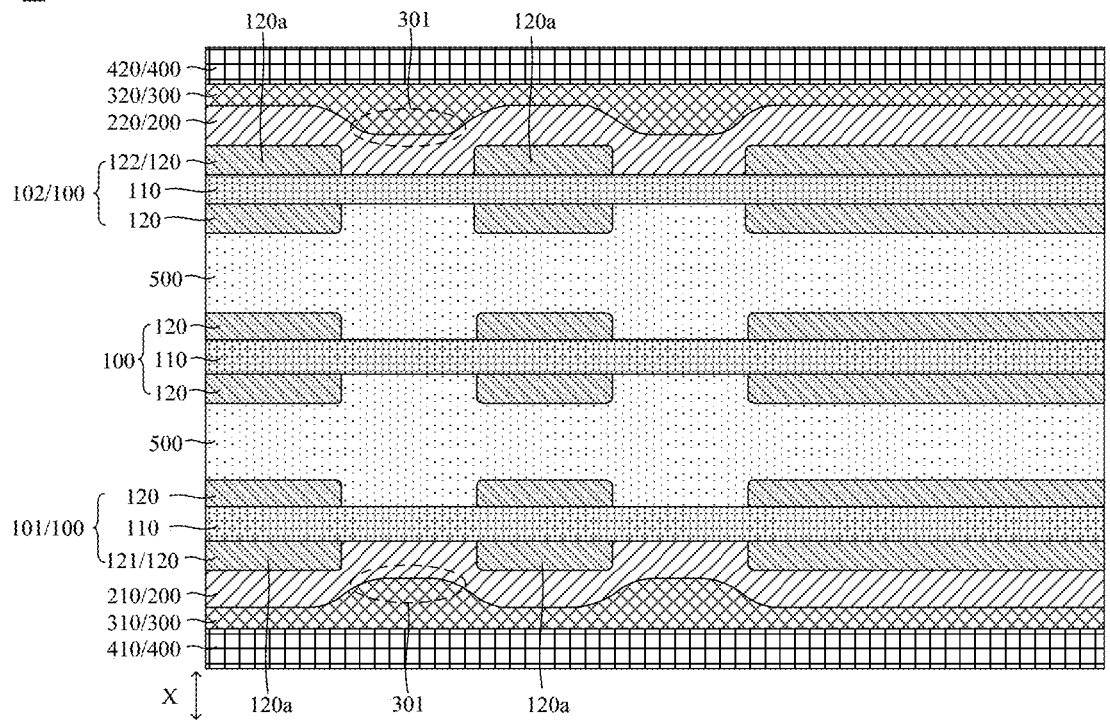
FIG. 7 is a sectional view of yet another circuit board taken along a direction perpendicular to an extending direction of signal lines in a conductive layer, in accordance with some embodiments.

In some embodiments, as shown in FIG. 6, the circuit board 10 includes one circuit board unit 100, and in this case, the two conductive layers 120 included in the circuit board unit 100 are the outermost conductive layers, and are referred to as the first conductive layer 121 and the second conductive layer 122, respectively. It will be understood that the first conductive layer 121 and the second conductive layer 122 are located on the two opposite sides of the same substrate layer 110, respectively.

In some other embodiments, as shown in FIG. 7, the circuit board 10 includes a plurality of circuit board units 100. In this case, in the plurality of circuit board units 100, two circuit board units 100 respectively located on the two opposite outermost sides in the thickness direction (i.e., the thickness direction X of the substrate layer 110) of the circuit board 10 are referred to as a first circuit board unit 101 and a second circuit board unit 102, respectively. In the first circuit board unit 101, the conductive layer 120 located on a side of the substrate layer 110 in the first circuit board unit 101 proximate to the outside is the outermost conductive layer, and is referred to as the first conductive layer 121. In the second circuit board unit 102, the conductive layer 120 located on a side of the substrate layer 110 in the second circuit board unit 102 proximate to the outside is the outermost conductive layer, and is referred to as the second conductive layer 122.

In some embodiments, the insulating layer 200 may be provided only on a side of the first conductive layer 121 away from the substrate layer 110. Or, the insulating layer 200 may be provided only on a side of the second conductive layer 122 away from the substrate layer 110. Or, the insulating layers 200 may be respectively provided on the side of the first conductive layer 121 away from the substrate layer 110 and the side of the second conductive layer 122 away from the substrate layer 110. For example, as shown in FIG. 3, in a case where the insulating layers 200 are respectively provided on the side of the first conductive layer 121 away from the substrate layer 110 and the side of the second conductive layer 122 away from the substrate layer 110, the circuit board 10 includes a first insulating layer 210 disposed on the side of the first conductive layer 121 away from the substrate layer 110 and a second insulating layer 220 disposed on the side of the second conductive layer 122 away from the substrate layer 110.

It will be understood that in a case where the circuit board 10 includes one circuit board unit 100, the substrate layer 110 is the substrate layer 110 included in the circuit board unit 100. In a case where the circuit board 10 includes the plurality of circuit board units 100, the substrate layer 110 may be the substrate layer 110 included in any one of the circuit board units 100.

In some embodiments, the insulating layer 200 is made of an insulating material including an insulating ink.

The electromagnetic shielding layer 400 is located on a side of the insulating layer 200 away from the substrate layer 110. In some embodiments, as shown in FIG. 3, the circuit board 10 includes the first insulating layer 210 and the second insulating layer 220, and on this basis, the circuit board 10 includes a first electromagnetic shielding layer 410 located on a side of the first insulating layer 210 away from the substrate layer 110 and a second electromagnetic shielding layer 420 located on a side of the second insulating layer 220 away from the substrate layer 110.

In some embodiments, the barrier layer 300 is located between the insulating layer 200 and the electromagnetic shielding layer 400. For example, as shown in FIG. 3, the circuit board 10 includes the first insulating layer 210 and the second insulating layer 220, and the first electromagnetic shielding layer 410 and the second electromagnetic shielding layer 420. In this case, the circuit board 10 includes a first barrier layer 310 disposed between the first insulating layer 210 and the first electromagnetic shielding layer 410, and a second barrier layer 320 disposed between the second insulating layer 220 and the second electromagnetic shielding layer 420.

It will be understood that in a direction away from the circuit board 10 in the thickness direction of the circuit board 10, the first insulating layer 210, the first barrier layer 310, and the first electromagnetic shielding layer 410 are sequentially arranged on the side of the first conductive layer 121 away from the substrate layer 110, and the second insulating layer 220, the second barrier layer 320, and the second electromagnetic shielding layer 420 are sequentially arranged on the side of the second conductive layer 122 away from the substrate layer 110.

Figure 9:
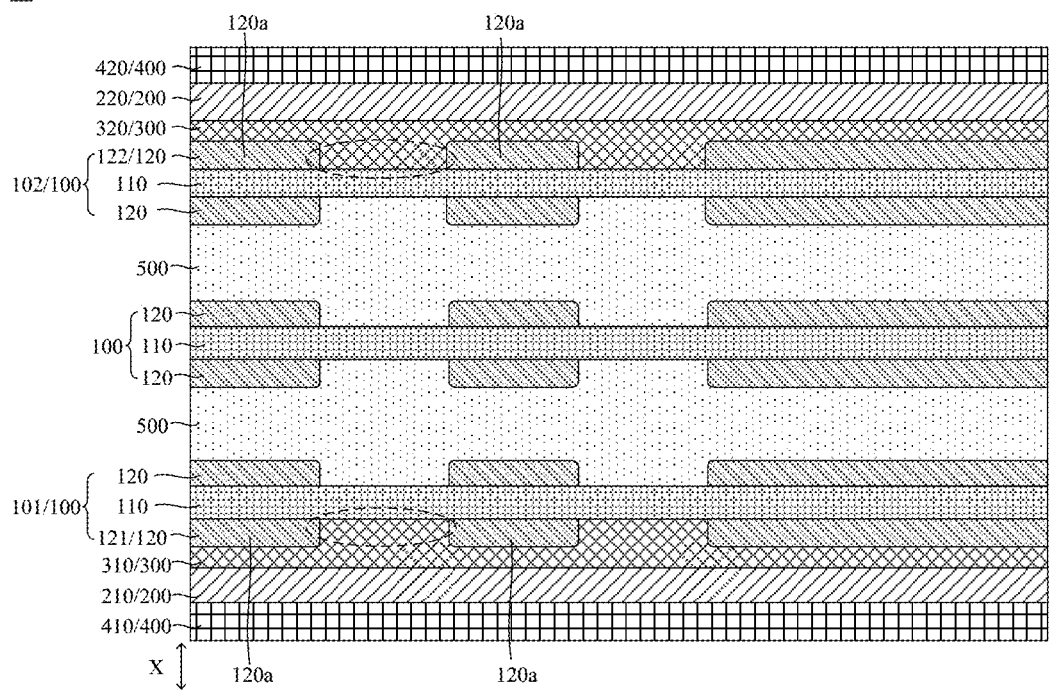
FIG. 9 is a sectional view of yet another circuit board taken along a direction perpendicular to an extending direction of signal lines in a conductive layer, in accordance with some embodiments.
Figure 10:
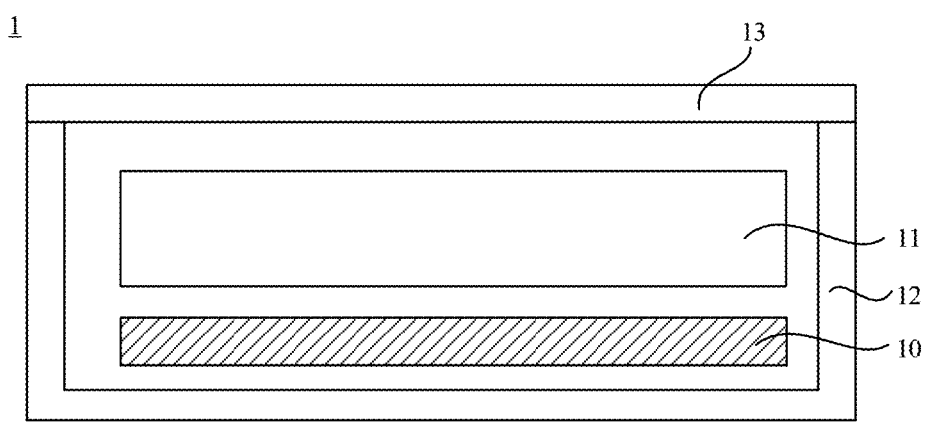
FIG. 10 is a structural diagram of a display device, in accordance with some embodiments.

In some other embodiments, the barrier layer 300 is located between the outermost conductive layer and the insulating layer 200. For example, as shown in FIG. 9, the circuit board 10 includes the first insulating layer 210 and the second insulating layer 220, and the first electromagnetic shielding layer 410 and the second electromagnetic shielding layer 420. In this case, the circuit board 10 includes a first barrier layer 310 disposed between the first conductive layer 121 and the first insulating layer 210, and a second barrier layer 320 disposed between the second conductive layer 122 and the second insulating layer 220.

It will be understood that in a direction away from the circuit board 10 in the thickness direction of the circuit board 10, the first barrier layer 310, the first insulating layer 210, and the first electromagnetic shielding layer 410 are sequentially arranged on the side of the first conductive layer 121 away from the substrate layer 110, and the second barrier layer 320, the second insulating layer 220, and the second electromagnetic shielding layer 420 are sequentially arranged on the side of the second conductive layer 122 away from the substrate layer 110.

Figure 4:
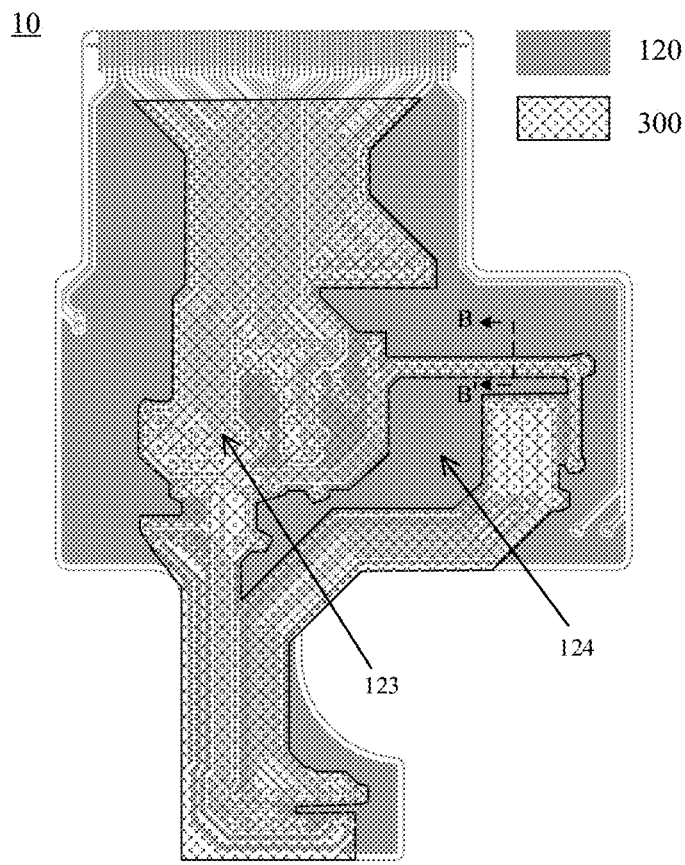
FIG. 4 is a top view of another circuit board, in accordance with some embodiments.
Figure 5:
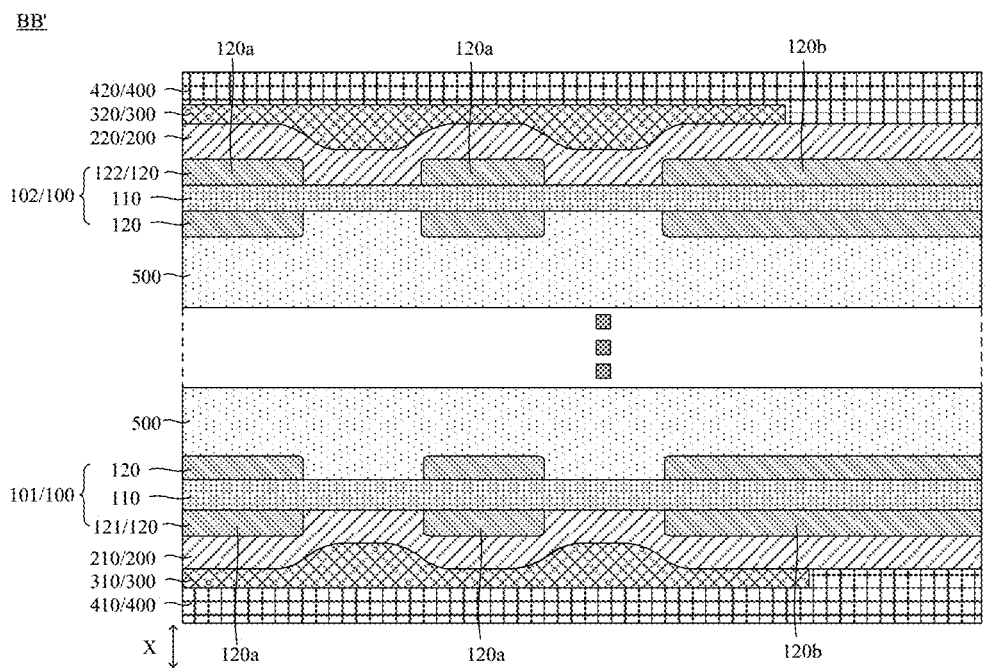
FIG. 5 is a sectional view of the circuit board shown in FIG. 4 taken along the BB' line.

The barrier layer 300 at least covers the plurality of signal lines 120a in the outermost conductive layer. In some embodiments, the barrier layer 300 may cover the entire outermost conductive layer, or may only cover the plurality of signal lines 120a in the outermost conductive layer. For example, as shown in FIGS. 2 and 3, the first barrier layer 310 and the second barrier layer 320 cover the first conductive layer 121 and the second conductive layer 122, respectively. As shown in FIGS. 4 and 5, the first barrier layer 310 and the second barrier layer 320 cover the plurality of signal lines 120a in the first conductive layer 121 and the plurality of signal lines 120a in the second conductive layer 122, respectively.

In some embodiments, the barrier layer 300 is made of an insulating material including at least one of polyimide and epoxy resin.

In the circuit board in some embodiments of the present disclosure, the barrier layer made of the insulating material is added between the insulating layer 200 and the electromagnetic shielding layer 400, so as to block a copper migration due to an action of an electric field between the signal line 120a and the electromagnetic shielding layer 400 in the circuit board 10, thereby solving a problem of black screen, blurred screen, or splash screen of a display device due to a short circuit caused by the copper migration.

In some embodiments, as shown in FIG. 3, the circuit board 10 includes the plurality of circuit board units 100, and in this case, the circuit board 10 further includes an adhesive layer 500 disposed between two adjacent circuit board units 100. The adhesive layer 500 is configured to bond the two adjacent circuit board units 100 together, and is configured such that the two adjacent circuit board units 100 are insulated from each other. The plurality of circuit board units 100 are sequentially connected through the adhesive layers 500 (also called prepreg layers), and electrical connections between the conductive layers 120 in different circuit board units 100 are realized by prefabricating conductive vias in the adhesive layers 500.

It will be understood that the two conductive layers 120 in each circuit board unit 100 are electrically connected to each other through the conductive via(s).

Figure 8:
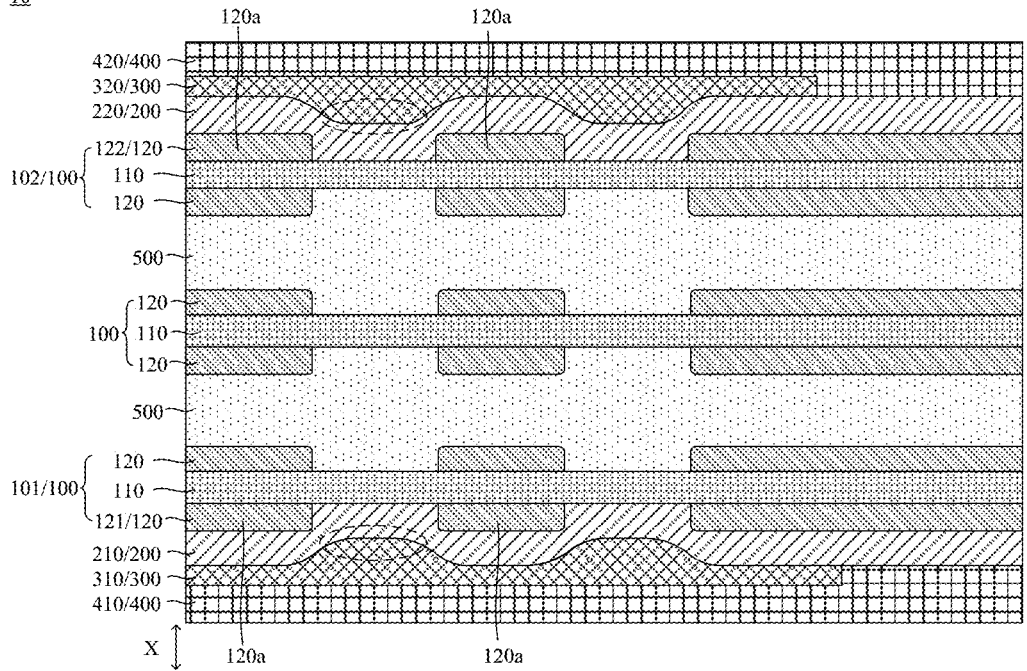
FIG. 8 is a sectional view of yet another circuit board taken along a direction perpendicular to an extending direction of signal lines in a conductive layer, in accordance with some embodiments.

As shown in FIGS. 7 to 9, the circuit board 10 will be described below in an example where the circuit board 10 is a six-layer board (including three circuit board units 100, i.e., six conductive layers 120).

The circuit board 10 includes a first layer circuit board unit 100, a second layer circuit board unit 100, and a third layer circuit board unit 100 from bottom to top. The conductive layer 120 in the first layer circuit board unit 100 is connected to the conductive layer 120 in the second layer circuit board unit 100 through the adhesive layer 500, and the conductive layer 120 in the second layer circuit board unit 100 is connected to the conductive layer 120 in the third layer circuit board unit 100 through the adhesive layer 500.

In this circuit board 10, the first layer circuit board unit 100 and the third layer circuit board unit 100 are respectively located on the two opposite outermost sides in the thickness direction of the circuit board 10, and are referred to as the first circuit board unit 101 and the second circuit board unit 102, respectively. In the first circuit board unit 101, the conductive layer 120 (the conductive layer at the bottom) located on the side of the substrate layer 110 in the first circuit board unit 101 proximate to the outside is referred to as the first conductive layer 121. In the second circuit board unit 102, the conductive layer 120 (the conductive layer at the top) located on the side of the substrate layer 110 in the second circuit board unit 102 proximate to the outside is referred to as the second conductive layer 122.

In some embodiments, as shown in FIG. 7, the first insulating layer 210 is provided on the side of the first conductive layer 121 away from the substrate layer 110, the first barrier layer 310 is provided on the side of the first insulating layer 210 away from the substrate layer 110, and the first electromagnetic shielding layer 410 is provided on a side of the first barrier layer 310 away from the substrate layer 110. The first barrier layer 310 at least covers the plurality of signal lines 120a in the first conductive layer 121, so as to block copper particles in the signal lines 120a in the first conductive layer 121 from migrating to the first electromagnetic shielding layer 410 to avoid short circuits.

It will be understood that the substrate layer 110 may be the substrate layer 110 in the first layer circuit board unit 100, the substrate layer 110 in the second layer circuit board unit 100, or the substrate layer 110 in the third layer circuit board unit 100.

Similarly, the second insulating layer 220 is provided on the side of the second conductive layer 122 away from the substrate layer 110, the second barrier layer 320 is provided on the side of the second insulating layer 220 away from the substrate layer 110, and the second electromagnetic shielding layer 420 is provided on a side of the second barrier layer 320 away from the substrate layer 110. The second barrier layer 320 at least covers the plurality of signal lines 120a in the second conductive layer 122, so as to block copper particles in the signal lines 120a in the second conductive layer 122 from migrating to the second electromagnetic shielding layer 420 to avoid short circuits.

In some other embodiments, as shown in FIG. 9, the first barrier layer 310 is provided on the side of the first conductive layer 121 away from the substrate layer 110, the first insulating layer 210 is provided on a side of the first barrier layer 310 away from the substrate layer 110, and the first electromagnetic shielding layer 410 is provided on the side of the first insulating layer 210 away from the substrate layer 110. The first barrier layer 310 at least covers the plurality of signal lines 120a in the first conductive layer 121, so as to block copper particles in the signal lines 120a in the first conductive layer 121 from migrating to the first electromagnetic shielding layer 410 to avoid short circuits.

It will be understood that the substrate layer 110 may be the substrate layer 110 in the first layer circuit board unit 100, the substrate layer 110 in the second layer circuit board unit 100, or the substrate layer 110 in the third layer circuit board unit 100.

Similarly, the second barrier layer 320 is provided on the side of the second conductive layer 122 away from the substrate layer 110, the second insulating layer 220 is provided on a side of the second barrier layer 320 away from the substrate layer 110, and the second electromagnetic shielding layer 420 is provided on the side of the second insulating layer 220 away from the substrate layer 110. The second barrier layer 320 at least covers the plurality of signal lines 120a in the second conductive layer 122, so as to block copper particles in the signal lines 120a in the second conductive layer 122 from migrating to the second electromagnetic shielding layer 420 to avoid short circuits.

In some embodiments, a boundary of the insulating layer 200 substantially coincides with a boundary of the substrate layer 110. That is, the insulating layer 200 covers the entire substrate layer 110, and is a whole layer, which simplifies the manufacturing process.

On this basis, a contour line of an orthogonal projection of the barrier layer 300 on the substrate layer 110 is substantially overlapped with a contour line of an orthogonal projection of the insulating layer 200 on the substrate layer 110. That is, a coverage area of the barrier layer 300 is the same as a coverage area of the insulating layer 200, and the barrier layer 300 is also a whole layer. The barrier layer 300 may be manufactured by using a whole surface coating process, which simplifies the manufacturing process.

For example, as shown in FIGS. 2 and 3, a contour line of an orthogonal projection of the first barrier layer 310 on the substrate layer 110 is substantially overlapped with a contour line of an orthogonal projection of the first insulating layer 210 on the substrate layer 110. A contour line of an orthogonal projection of the second barrier layer 320 on the substrate layer 110 is substantially overlapped with a contour line of an orthogonal projection of the second insulating layer 220 on the substrate layer 110.

In some embodiments, as shown in FIGS. 4 and 5, the outermost conductive layer has a signal line region 123 and a ground region 124. The outermost conductive layer includes the plurality of signal lines 120a and ground pattern(s) 120b. The plurality of signal lines 120a are located in the signal line region 123, and the ground pattern(s) 120b are located in the ground region 124.

On this basis, a contour line of an orthogonal projection of the signal line region 123 of the outermost conductive layer on the substrate layer 110 is within a range of the contour line of the orthogonal projection of the barrier layer 300 on the substrate layer 110. That is, the barrier layer 300 only covers the signal line region 123 of the outermost conductive layer. By this arrangement, only the thickness of the signal line region 123 of the outermost conductive layer is increased, and thicknesses of other regions of the circuit board are unchanged, which is beneficial to lightening and thinning a display device.

It will be understood that a shape of the barrier layer 300 is substantially the same as a shape of the signal line region 123 of the outermost conductive layer.

For example, the first barrier layer 310 is formed by using a patterning process. As shown in FIG. 5, a contour line of an orthogonal projection of the signal line region 123 of the first conductive layer 121 on the substrate layer 110 is within a range of a contour line of an orthogonal projection of the first barrier layer 310 on the substrate layer 110. That is, the first barrier layer 310 only covers the signal line region 123 of the first conductive layer 121.

The second barrier layer 320 is formed by using a patterning process. A contour line of an orthogonal projection of the signal line region 123 of the second conductive layer 122 on the substrate layer 110 is within a range of a contour line of an orthogonal projection of the second barrier layer 320 on the substrate layer 110. That is, the second barrier layer 320 only covers the signal line region 123 of the second conductive layer 122.

Considering the barrier effect on an edge portion of the signal line region 123 of the outermost conductive layer, a region enclosed by an edge of the barrier layer 300 is required to be expanded by a distance, so that the contour line of the orthogonal projection of the barrier layer 300 on the substrate layer 110 is closer to an edge of the substrate layer 110, relative to the contour line of the orthogonal projection of the signal line region 123 of the outermost conductive layer on the substrate layer 110.

In some embodiments, considering the barrier effect on the migration of copper particles and the thickness of the circuit board, a region enclosed by the contour line of the orthogonal projection of the barrier layer 300 on the substrate layer 110 is expanded by 0.2 mm to 0.8 mm, such as 0.2 mm, 0.3 mm, 0.4 mm, 0.5 mm, 0.6 mm, 0.7 mm, or 0.8 mm, relative to a region enclosed by the contour line of the orthogonal projection of the signal line region 123 of the outermost conductive layer on the substrate layer 110.

In some embodiments, in order to better ensure the barrier effect of the barrier layer 300 on the migration of copper particles, the region enclosed by the contour line of the orthogonal projection of the barrier layer 300 on the substrate layer 110 is expanded by 0.5 mm to 0.8 mm, relative to the region enclosed by the contour line of the orthogonal projection of the signal line region 123 of the outermost conductive layer on the substrate layer 110.

It will be noted that the term "expanded by" means that the region enclosed by the contour line of the orthogonal projection of the barrier layer 300 on the substrate material layer 110 is expanded, so that each side of the contour line of the orthogonal projection of the barrier layer 300 on the substrate material layer 110 has a certain distance from a corresponding side of the contour line of the orthogonal projection of the signal line region 123 of the outermost conductive layer on the substrate layer 110.

For example, as shown in FIGS. 4 and 5, a region enclosed by the contour line of the orthogonal projection of the first barrier layer 310 on the substrate layer 110 is expanded by a certain distance, and is closer to the edge of the substrate layer 110, relative to the region enclosed by the contour line of the orthogonal projection of the signal line region 123 of the first conductive layer 121 on the substrate layer 110.

A region enclosed by the contour line of the orthogonal projection of the second barrier layer 320 on the substrate layer 110 is expanded by a certain distance, and is closer to the edge of the substrate layer 110, relative to the region enclosed by the contour line of the orthogonal projection of the signal line region 123 of the second conductive layer 122 on the substrate layer 110.

In some embodiments, the barrier layer 300 is located between the insulating layer 200 and the electromagnetic shielding layer 400, and a plurality of protrusions 301 are provided in a surface of the barrier layer 300 proximate to the substrate layer 110. An orthogonal projection of the protrusion 301 on the substrate layer 110 is at least partially overlapped with an orthogonal projection of a gap region between two adjacent signal lines 120a in the outermost conductive layer on the substrate layer 110. Since the protrusion 301 is located in the gap region between two adjacent signal lines 120a in the outermost conductive layer, the thickness of a portion of the barrier layer 300 located between the two adjacent signal lines 120a is increased, so that a distance that copper particles at an edge of the signal line 120a in the outermost conductive layer move in the portion of the barrier layer 300 is increased, and the probability of the migration of copper particles is reduced.

It will be noted that the protrusions 301 are a portion of the barrier layer 300, and are formed by filling the insulating material of the barrier layer 300 in the gap region between two adjacent signal lines 120a when the barrier layer 300 is manufactured.

For example, as shown in FIG. 7, a plurality of protrusions 301 are provided on a surface of the first barrier layer 310 proximate to the substrate layer 110. An orthogonal projection of the protrusion 301 on the substrate layer 110 is at least partially overlapped with an orthogonal projection of a gap region between two adjacent signal lines 120a in the first conductive layer 121 on the substrate layer 110. That is, the protrusion 301 is located in the gap region between two adjacent signal lines 120a in the first conductive layer 121.

A plurality of protrusions 301 are provided on a surface of the second barrier layer 320 proximate to the substrate layer 110. An orthogonal projection of the protrusion 301 on the substrate layer 110 is at least partially overlapped with an orthogonal projection of a gap region between two adjacent signal lines 120a in the second conductive layer 122 on the substrate layer 110. That is, the protrusion 301 is located in the gap region between two adjacent signal lines 120a in the second conductive layer 122.

In some embodiments, the protrusion 301 is strip-shaped, and extends in an extending direction of the signal lines 120a.

In some embodiments, a surface of the barrier layer 300 away from the substrate layer 110 is substantially planar, thereby playing a role of planarization.

In some embodiments, the surface of the barrier layer 300 away from the substrate layer 110 is substantially parallel to a surface of the substrate layer 110.

For example, as shown in FIG. 7, a surface of the first barrier layer 310 away from the substrate layer 110 is substantially planar, and is substantially parallel to the surface of the substrate layer 110. A surface of the second barrier layer 320 away from the substrate layer 110 is substantially planar, and is substantially parallel to the surface of the substrate layer 110.

In some embodiments, the thickness of a portion of the barrier layer 300 that is opposite to the signal lines 120a in the outermost conductive layer is in a range of 10 μm to 25 μm, such as 10 μm, 12 μm, 15 μm, 17 μm, 20 μm, 23 μm, or 25 μm. On the premise of ensuring the barrier effect on the migration of copper particles, the thickness of the entire circuit board 10 may be controlled.

Some embodiments of the present disclosure further provide a display device 1. The display device 1 includes a display panel 11 and the circuit board 10 as described in the above embodiments. The circuit board 10 is electrically connected to the display panel 11.

In some embodiments, the display device 1 may be a mobile phone, a TV, or a tablet computer.

In some embodiments, the display panel 11 may be a liquid crystal display (LCD) panel, an organic light-emitting diode (OLED) display panel, or a quantum dot light-emitting diode (QLED) display panel.

In some embodiments, in a case where the display device 1 is a touch display product, the circuit board 10 may be a flexible circuit board (FPC), a rigid-flex circuit board (RFPC), or a rigid circuit board (PCB).

For example, the display device 1 includes the display panel 11, the circuit board 10, a frame 12, a cover plate 13 and other electronic accessories. In a case where the display panel 11 is the liquid crystal display panel, the display device 1 further includes a backlight module.

A longitudinal section of the frame 12 is U-shaped, and the display panel 11, the circuit board 10 and other accessories are all provided in the frame 12. The circuit board 10 is provided below the display panel 11 (i.e., a back surface of the display panel 11, which is a surface facing away from a display surface of the display panel 11). The cover plate 13 is provided on a side of the display panel 11 away from the circuit board 10. In the case where the display panel 11 is the liquid crystal display panel, and the display device 1 includes the backlight module, the backlight module may be provided between the display panel 11 and the circuit board 10.

The display device in some embodiments of the present disclosure includes the circuit board provided with the barrier layer between the insulating layer and the electromagnetic shielding layer or between the outermost conductive layer and the insulating layer, so as to block the copper migration due to the action of the electric field between the signal line 120a and the electromagnetic shielding layer in the circuit board, thereby solving the problem of black screen, blurred screen, or splash screen of the display device due to the short circuit caused by the copper migration.

Some embodiments of the present disclosure further provide a method for manufacturing a circuit board, which is used for manufacturing the circuit board in the foregoing embodiments. The method includes S1 to S4.

In S1, the plurality of circuit board units 100 are combined. The circuit board unit 100 includes the substrate layer 110 and two conductive layers 120 respectively disposed on two opposite sides of the substrate layer 110 in the thickness direction X of the substrate layer 110. The conductive layer 120 includes the plurality of signal lines 120a.

Two circuit board units 100 respectively located on the two opposite outermost sides in the thickness direction of the circuit board 10 are the first circuit board unit 101 and the second circuit board unit 102, respectively. In the first circuit board unit 101, the conductive layer 120 on the side of the substrate layer 110 in the first circuit board unit 101 proximate to the outside is referred to as the first conductive layer 121. In the second circuit board unit 102, the conductive layer 120 on the side of the substrate layer 110 in the second circuit board unit 102 proximate to the outside is referred to as the second conductive layer 122.

In S2, the first insulating layer 210 is manufactured on the side of the first conductive layer 121 away from the substrate layer 110, and the second insulating layer 220 is manufactured on the side of the second conductive layer 122 away from the substrate layer 110.

In S3, the first barrier layer 310 is manufactured on the side of the first insulating layer 210 away from the substrate layer 110 by using an insulating material, and the second barrier layer 320 is manufactured on the side of the second insulating layer 220 away from the substrate layer 110 by using an insulating material. The first barrier layer 310 at least covers the plurality of signal lines 120a in the first conductive layer 121, and the second barrier layer 320 at least covers the plurality of signal lines 120a in the second conductive layer 122.

In S4, the first electromagnetic shielding layer 410 is manufactured on the side of the first barrier layer 310 away from the substrate layer 110, and the second electromagnetic shielding layer 420 is manufactured on the side of the second barrier layer 320 away from the substrate layer 110.

In some embodiments, in order to obtain the first barrier layer 310 having a similar profile to the signal line region 123 of the first conductive layer 121, the first barrier layer 310 may be entirely manufactured, and then patterned, so that only the first barrier layer 310 for covering the signal line region 123 of the first conductive layer 121 is retained.

In some embodiments, in order to obtain the second barrier layer 320 having a similar profile to the signal line region 123 of the second conductive layer 122, the second barrier layer 320 may be entirely manufactured, and then patterned, so that only the second barrier layer 320 for covering the signal line region 123 of the second conductive layer 122 is retained.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A circuit board, comprising: at least one circuit board unit sequentially stacked in a thickness direction of the circuit board, the circuit board unit including a substrate layer and two conductive layers respectively disposed on two opposite sides of the substrate layer in a thickness direction of the substrate layer, and each of the conductive layers including a plurality of signal lines; an insulating layer located on a side of an outermost conductive layer away from the substrate layer; an electromagnetic shielding layer located on a side of the insulating layer away from the substrate layer; and a barrier layer located between the electromagnetic shielding layer and the outermost conductive layer; the barrier layer at least covering a plurality of signals lines in the outermost conductive layer, wherein the outermost conductive layer has a signal line region, and the plurality of signal lines in the outermost conductive layer are located in the signal line region; a contour line of an orthogonal projection of the signal line region of the outermost conductive layer on the substrate layer is within a range of a contour line of an orthogonal projection of the barrier layer on the substrate layer.

2. The circuit board according to claim 1, wherein conductive layers in the at least one board unit include:
   a first conductive layer and a second conductive layer respectively located on two opposite outermost sides in the thickness direction of the circuit board;
   a first insulating layer, a first barrier layer, and a first electromagnetic shielding layer that are disposed on a side of the first conductive layer away from the substrate layer; in a direction away from the circuit board in the thickness direction of the circuit board, the first insulating layer, the first barrier layer, and the first electromagnetic shielding layer being sequentially arranged, or the first barrier layer, the first insulating layer, and the first electromagnetic shielding layer being sequentially arranged; and
   a second insulating layer, a second barrier layer, and a second electromagnetic shielding layer that are disposed on a side of the second conductive layer away from the substrate layer; in a direction away from the circuit board in the thickness direction of the circuit board, the second insulating layer, the second barrier layer, and the second electromagnetic shielding layer being sequentially arranged, or the second barrier layer, the second insulating layer, and the second electromagnetic shielding layer being sequentially arranged.

3. The circuit board according to claim 2, wherein the at least one circuit board unit includes one circuit board unit, and the first conductive layer and the second conductive layer are respectively located on two opposite sides of the same substrate layer.

4. The circuit board according to claim 2, wherein the at least one circuit board unit includes a plurality of circuit board units, and two circuit board units respectively located on the two opposite outermost sides are referred to as a first circuit board unit and a second circuit board unit, respectively;
   the first conductive layer is located on a side of a substrate layer in the first circuit board unit proximate to the outside, and the second conductive layer is located on a side of a substrate layer in the second circuit board unit proximate to the outside.

5. The circuit board according to claim 4, further comprising an adhesive layer disposed between two adjacent circuit board units, wherein the adhesive layer is configured to bond the two adjacent circuit board units, and is configured such that the two adjacent circuit board units are insulated from each other.

6. The circuit board according to claim 1, wherein a contour line of an orthogonal projection of the barrier layer on the substrate layer is substantially overlapped with a contour line of an orthogonal projection of the insulating layer on the substrate layer.

7. The circuit board according to claim 1, wherein a distance between two adjacent sides of the contour line of the orthogonal projection of the barrier layer on the substrate layer and the contour line of the orthogonal projection of the signal line region of the outermost conductive layer on the substrate layer is in a range of 0.2 mm to 0.8 mm.

8. The circuit board according to claim 7, wherein the distance between two adjacent sides of the contour line of the orthogonal projection of the barrier layer on the substrate layer and the contour line of the orthogonal projection of the signal line region of the outermost conductive layer on the substrate layer is in a range of 0.5 mm to 0.8 mm.

9. The circuit board according to claim 1, wherein a shape of the barrier layer is substantially same as a shape of the signal line region of the outermost conductive layer.

10. The circuit board according to claim 1, wherein the outermost conductive layer further has a ground region;
    the outermost conductive layer further includes a ground pattern in the ground region.

11. The circuit board according to claim 1, wherein a boundary of the insulating layer substantially coincides with a boundary of the substrate layer.

12. The circuit board according to claim 1, wherein the barrier layer is located between the insulating layer and the electromagnetic shielding layer, and a plurality of protrusions are disposed in a surface of the barrier layer proximate to the substrate layer; an orthogonal projection of a protrusion on the substrate layer is at least partially overlapped with an orthogonal projection of a gap region between two adjacent signal lines in the outermost conductive layer on the substrate layer.

13. The circuit board according to claim 12, wherein the protrusion is strip-shaped, and extends in an extending direction of the signal lines.

14. The circuit board according to claim 12, wherein a surface of the barrier layer away from the substrate layer is substantially planar.

15. The circuit board according to claim 12, wherein a surface of the barrier layer away from the substrate layer is substantially parallel to a surface of the substrate layer.

16. The circuit board according to claim 1, wherein a thickness of a portion of the barrier layer that is opposite to the signal lines in the outermost conductive layer is in a range of 10 μm to 25 μm.

17. The circuit board according to claim 1, wherein a material of the insulating layer includes ink.

18. The circuit board according to claim 1, wherein a material of the barrier layer includes at least one of polyimide and epoxy resin.

19. A display device, comprising:
   a display panel; and
   the circuit board according to claim 1, the circuit board being electrically connected to the display panel.

* * * * *